United States Patent [19]
Fitzgerald et al.

[11] Patent Number: 5,561,029
[45] Date of Patent: Oct. 1, 1996

[54] LOW-VOLATILITY, SUBSTITUTED 2-PHENYL-4,6-BIS (HALOMETHYL)-1,3,5-TRIAZINE FOR LITHOGRAPHIC PRINTING PLATES

[75] Inventors: Maurice J. Fitzgerald, Canton; Frederick R. Kearney, Walpole; Rong-Chang Liang, Newton; William C. Schwarzel, Billerica; Donna J. Guarrera, Norwood; John M. Hardin, Jamaica Plain; John C. Warner, Norwood, all of Mass.

[73] Assignee: Polaroid Corporation, Cambridge, Mass.

[21] Appl. No.: 430,461

[22] Filed: Apr. 28, 1995

[51] Int. Cl.$^6$ ........................................... G03F 7/031
[52] U.S. Cl. .................. 430/281.1; 430/920; 430/926; 430/919; 522/39; 522/46; 522/16; 522/33
[58] Field of Search ................................. 430/281, 270, 430/920, 926, 919, 281.1, 271.1; 522/9, 14, 39, 46, 16, 33

[56] References Cited

U.S. PATENT DOCUMENTS

| | | | |
|---|---|---|---|
| 4,189,323 | 2/1980 | Buhr | 430/281 |
| 4,258,123 | 3/1981 | Nagashima et al. | 430/281 |
| 4,330,590 | 5/1982 | Vesley | 428/336 |
| 4,391,687 | 7/1983 | Vesley | 204/159.16 |
| 4,619,998 | 10/1986 | Buhr | 251/20 |
| 4,696,888 | 9/1987 | Buhr | 430/270 |
| 4,758,497 | 7/1988 | Shah et al. | 430/193 |
| 4,772,534 | 9/1988 | Kawamura et al. | 430/176 |
| 4,774,163 | 9/1988 | Higashi | 430/281 |
| 4,837,128 | 6/1989 | Kawamura et al. | 430/281 |
| 4,851,319 | 7/1989 | Walls et al. | 430/157 |
| 4,895,788 | 1/1990 | Walls et al. | 430/278 |
| 4,912,218 | 3/1990 | Coyle et al. | 544/216 |
| 4,933,452 | 6/1990 | White et al. | 544/204 |
| 4,935,330 | 6/1990 | Hofmann et al. | 430/281 |
| 4,985,562 | 1/1991 | Rossman et al. | 544/209 |

(List continued on next page.)

Primary Examiner—Cynthia Hamilton
Attorney, Agent, or Firm—Renato M. de Luna

[57] ABSTRACT

The present invention sets forth the incorporation of a substituted 2-phenyl-4,6-bis (trichloromethyl)-1,3,5-triazine in photoresists of lithographic printing plates for the purpose of promoting their shelf-life, room light stability, and developability. The present invention provides a photocurable composition comprising at least a photopolymerizable ethylenically unsaturated monomer having at least one terminal ethylenic group and capable of forming a polymer upon exposure to actinic radiation; and an s-triazine capable of initiating free radical polymerization of the photopolymerizable ethylenically unsaturated monomer and being represented by the following general formula [I]:

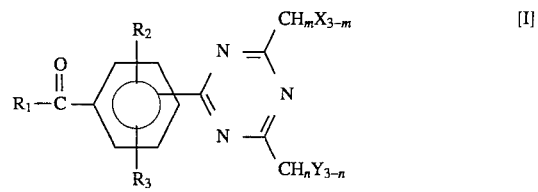

wherein $R_1$ is either $OR_4$ or $NR_5R_6$, wherein $R_5$ and $R_6$ may or may not be identical with each other, either $R_5$ or $R_6$ may represent hydrogen, and wherein $R_4$ and at least one of $R_5$ and $R_6$ represent a ballast group capable of preventing the substantial volatilization of the s-triazine from the photoresist composition, the ballast group being a substituted or unsubstituted alkyl group, or a substituted or unsubstituted aryl group, the substituted or unsubstituted alkyl group having at least 4 carbon atoms, the substituted or unsubstituted aryl group having at least 6 carbon atoms; $R_2$ and $R_3$ may or may not be identical with each other and each represent hydrogen, halogen, phenyl, a substituted or unsubstituted alkyl group, or an alkoxyl group; X and Y may or may not be identical with each other and each represent chlorine or bromine; and m and n may or may not be identical with each other and are each an integer of 0, 1, or 2. Desirable compositions will further comprise at least one photooxidizable leuco triarylmethane dye.

12 Claims, 4 Drawing Sheets

U.S. PATENT DOCUMENTS

| | | | |
|---|---|---|---|
| 5,055,579 | 10/1991 | Pawlowski et al. | 544/216 |
| 5,064,741 | 11/1991 | Koike et al. | 430/191 |
| 5,064,959 | 11/1991 | Pawlowski et al. | 544/216 |
| 5,116,977 | 5/1992 | Rossman et al. | 544/113 |
| 5,198,325 | 3/1993 | Hupfer et al. | 430/330 |
| 5,216,158 | 6/1993 | Pawlowski et al. | 251/24 |
| 5,298,361 | 3/1994 | Bonham | 430/260 |
| 5,320,931 | 6/1994 | Umehara et al. | 430/270 |
| 5,340,697 | 8/1994 | Yoshimoto et al. | 430/270 |
| 5,362,874 | 11/1994 | Iwakura et al. | 544/216 |
| 5,364,734 | 11/1994 | Pawlowski et al. | 430/230 |

LOW-VOLATILITY, SUBSTITUTED 2-PHENYL-4,6-BIS (HALOMETHYL)-1,3,5-TRIAZINE FOR LITHOGRAPHIC PRINTING PLATES

FIELD OF THE INVENTION

The present invention relates generally to a photocurable composition, especially those suitable for lithographic printing plates, and more particularly, to the incorporation of a low-volatility, substituted 2-phenyl-4,6-bis (halomethyl)-1,3,5-triazine into a photoresist of a lithographic printing plate for the purpose of promoting shelf-life, room light stability, and developability, the s-triazine characterized by a carbonyl group immediately pendant the triazine's phenyl group, and the s-triazine having negligible or no light absorption at about $\lambda > 360$ nm.

BACKGROUND

At the present time, virtually all printed copy is produced through the use of three basic types of printing plates. One type is a relief plate which prints from a raised surface. Another type is an intaglio plate which prints from a depressed surface. The third type is a lithographic plate which prints from a substantially flat surface which is neither appreciably raised above nor appreciably depressed below the adjacent and surrounding non-printing areas. Printing is occasioned by an ink's respective affinity and/or aversion to areas of different chemical properties. Lithographic printing plates are commonly processed to have water-repellent (hydrophobic), oil-receptive (oleophilic) image areas and water-receptive (hydrophilic) non-image areas.

Prior to processing for use, conventional lithographic plates will typically have a hydrophobic, photoreactive polymeric layer (i.e. photoresist) coated or otherwise deposited atop a hydrophilic substrate.

In preparing a conventional lithographic plate for use on a printing press, the plate is first exposed to actinic radiation. Specific chemical reactions are caused to occur in the plate's photoresist by exposure to actinic radiation. Such photoinduced chemical reactions may either reduce or enhance the solubility of the photoresist, depending on whether the resist is negative-working or positive-working. In negative-working plates, exposure to actinic radiation will generally cause a "hardening" of the photoresist. In positive-working plates, exposure to actinic radiation will generally cause a softening or solubilization of the photoresist.

After photoexposure, a wet development step is normally conducted. The objective of such wet development is to remove those areas of the photoresist which have undergone photoinduced chemical change (in positive plates) or those which have not been photoexposed (in negative plates). Solvation under conventional development techniques will typically involve treating the exposed plate with developer in a developing bath. For negative-working resists, the developer will swell and dissolve the unexposed portions of the resist. The developer should not swell the exposed portions or distortion of the developed image may result. For positive-working resists, the response of the unexposed and exposed coatings are reversed, but the same general principles apply.

As a result of the preferential solvation and washing away of portions of the photoresist, corresponding portions of the underlying hydrophilic substrate are uncovered. For negative-working plates, the aforementioned hydrophobic image areas correspond to the portions of the photoresist remaining after solvation and washing. The aforementioned hydrophilic non-image areas correspond to uncovered portions of the substrate. The image and non-image areas thus differentiated, the processed plate may then be mounted onto a printing press and run.

Encumbered by required wet development, the processing of conventional lithographic plates prior to their use on a printing press is both time and labor consuming and involves considerable use of organic chemicals. It will be appreciated that there is a considerable desire for means that would satisfactorily eliminate or reduce conventional lithography's long-felt dependency upon the conduct of wet development and thereby permit use of lithographic plates on a printing press immediately after exposure without required post-exposure prepress processing.

In the past, dry developable lithographic printing plates have been suggested which enable the wet processing steps of lithographic printing plates after exposure to be omitted and printing to be conducted by directly mounting the exposed plates on a printing press. Among printing plates that may be characterized as on-press developable (or related thereto) are: e.g., U.S. Pat. No. 4,273,851, issued to Muzyczko et al. on Jun. 16, 1981; U.S. Pat. No. 4,879,201, issued to Hasegawa on Nov. 7, 1989; U.S. Pat. No. 4,916,041, issued to Hasegawa et al. on Apr. 10, 1990; U.S. Pat. No. 4,999,273, issued to Hasegawa on Mar. 12, 1991; and U.S. Pat. No. 5,258,263, issued to Z. K. Cheema, A. C. Giudice, E. L. Langlais, and C. F. St. Jacques on Nov. 2, 1993.

Despite the methodologies and approaches embodied in the aforementioned patents, there is a continuing need for a lithographic printing plate that can be readily developed on a printing press and that produces a plate having durable image areas needed for good run length. Applications for such on-press developable printing plates have been filed.

U.S. patent application Ser. Nos. 08/147,045 and 08/146,711, filed by W. C. Schwarzel, F. R. Kearney, M. J. Fitzgerald, and R. C. Liang on Nov. 1, 1993, describe a photoreactive polymeric binder that may be used to enhance photospeed in either conventional plates or on-press developable lithographic printing plates. Briefly, a polymer of m-isopropenyl-α,α-dimethylbenzyl isocyanate is derivatized for vinyl group reactivity by reacting the isocyanate groups thereof with a hydroxyalkyl acrylate, such as 4-hydroxybutyl acrylate. The resulting photopolymeric binder provides higher photospeed than compositions containing non-reactive binders typically utilized in the production of printing plates. Lithographic printing plates utilizing the photoreactive polymeric binder have good durability (as manifested by good run-length) and can be developed using relatively weak developers. As to the preparation of the photoreactive binders, the applications describe a method of copolymerizing m-isopropenyl-α,α-dimethylbenzyl isocyanate through complexation with an electron-deficient monomer (e.g., maleic anhydride) to accelerate free radical copolymerization with other monomers. The maleic anhydride accelerated process is kinetically more efficient and provides greater monomer-to-polymer conversion. Use of the resulting product in the photoresist of a lithographic printing plate improves its adhesion. The disclosures of commonly assigned U.S. patent application Ser. Nos. 08/147,045 and 08/146,711 are hereby incorporated by reference. Reference is also made to U.S. Pat. App. Att'y Dkt. No. C8024, commonly assigned and filed on Apr. 27, 1995.

U.S. patent application Ser. No. 08/147,044, filed by F. R. Kearney, J. M. Hardin, M. J. Fitzgerald, and R. C. Liang on Nov. 1, 1993, describes the use of plasticizers, surfactants and lithium salts as development aids for negative-working, on-press developable lithographic printing plates. Briefly, plasticizers, which are dispersible or soluble in press fountain solutions and soluble in acrylic monomers and oligomers, are incorporated into a photoresist. Such plasticizers make the photoresist more permeable to fountain solution prior to crosslinking, while being easily extracted with ink and fountain solution after crosslinking. The surfactants facilitate the dispersion of hydrophobic imaging compositions in the fountain solution and reduce scumming. Further, lithium salts may also be incorporated into the photoresist to disrupt hydrogen bonding of, for example, urethane acrylate polymers which tend to associate by hydrogen bonding, thus enhancing developability. The disclosure of commonly assigned U.S. patent application Ser. No. 08/147,044 is hereby incorporated by reference.

U.S. patent application Ser. No. 08/146,479, filed by L. C. Wan, A. C. Giudice, W. C. Schwarzel, C. M. Cheng, and R. C. Liang on Nov. 1, 1993, describes the use of rubbers and surfactants to enhance the durability of on-press developable printing plates. The rubbers are preferably incorporated into a photoresist as discrete rubber particles. To ensure a uniform and stable dispersion, the rubber components are suspended in the photoresist preferably by means of surfactants having HLBs approximately between 7.0 and 18.0. The disclosure of commonly assigned U.S. patent application Ser. No. 08/146,479, is hereby incorporated by reference.

It will be appreciated that underlying each of the referenced applications is an acknowledgment of the difficulty in the realization of both "on-press developability" on the one hand and "durability" on the other. Such difficulty is believed to originate from an apparent contradiction between photoresist resist removability ("developability") on the one hand and "durability" on the other: To make a photoresist more durable was to make a photoresist less developable.

To illustrate the point, it will be noted that conventional wet development techniques are oftentimes based upon the use of strong solvents. Accordingly, tough and comparatively resilient resists can be more liberally prepared and utilized. The dictates of more narrowly defined parameters for "on press developability", govern latitude in the choice of photoresist components, in general, and accordingly—as evident in the above-referenced applications—result in an unconventional resist configuration.

While the several resist configurations encompassed by the referenced applications provide good on-press developability, it is noted that accomplishment of optimal resolution and photospeed appeared frustrated in certain plates exposed to prolonged and elevated temperatures, such extreme conditions potentially arising during unmitigated shipping and/or storage.

Determination of the cause of such loss of photospeed and resolution is made difficult by the complex interrelationships of the several systems incorporated into such photoresists. Regardless, it is emphasized that the photoresists at issue are based on flee-radical initiated photopolymerization, the particular embodiments specifically employing 2-phenyl-4,6-bis(trichloromethyl)-1,3,5-triazine. In view of experimentation, in view of several and possible alternative factors, and in view of the unconventional and a generally low Tg configuration of the on-press developable photoresists, it is believed that loss of resolution and photospeed is attributable to the volatilization of 2-phenyl-4,6-bis(trichloromethyl)-1,3,5-triazine, the photooxidant being key to the free radical cure systems of the photoresist.

Such volatilization may be prevented by increasing the binder content of the photoresist, for example, thereby increasing Tg and the "rigidity" of the photoresist. However, a more "rigid" resist would be correspondingly more difficult to develop "on press". Rate of development and in turn resolution in part depends on the diffusion rate of developer (cf., fountain and ink solution) into the photoresist; a more "rigid" image coat may decrease the diffusion rate.

Alternatively, the prevention of volatilization of certain triazines can be accomplished by providing a ballast group thereon. Such methodology is employed, for example, in U.S. Pat. Nos. 5,298,361 (issued to Bonham et al. on Mar. 29, 1994); U.S. Pat. No. 5,064,741 (issued to Koike et al. on Nov. 12, 1991); U.S. Pat. No. 4,837,128 (issued to Kawamura et al. on Jun. 6, 1989); and U.S. Pat. No. 5,340,697 (issued to Yoshimoto et al. on Aug. 23, 1994). However—in employing such strategy to the particularly preferred triazine used in the above-referenced applications—unacceptable "scumming" defects were observed. (See Example 2, infra).

In light of the above, there is a need to develop a strategy for preventing the volatilization of a 2-phenyl-4,6-bis(trichloromethyl)-1,3,5-triazine from a photocurable composition, the strategy not leading to the aforementioned "scumming" defects when the photocurable composition is employed as a photoresist in a lithographic printing plate. The strategy should also desirably be directed toward reducing light absorption of the triazine at about $\lambda > 360$ nm, even when the triazine forms a charge transfer complex with a leuco triarylmethane dye.

SUMMARY OF THE INVENTION

In consideration of the above need, the present invention sets forth the incorporation of a substituted 2-phenyl-4,6-bis(halomethyl)-1,3,5-triazine in photoresists of lithographic printing plates for, but without limitation to, the purpose of enhancing their visible image, photospeed, shelf-life, and room light stability. The present invention encompasses a photocurable composition comprising at least a photopolymerizable ethylenically unsaturated monomer having at least one terminal ethylenic group and capable of forming a polymer upon exposure to actinic radiation; and an s-triazine capable of initiating free radical polymerization of the photopolymerizable ethylenically unsaturated monomer and being represented by the following general formula:

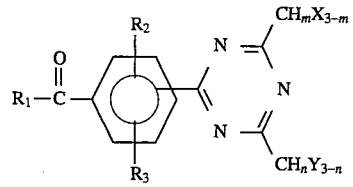

wherein $R_1$ is either $OR_4$ or $NR_5R_6$, wherein $R_5$ and $R_6$ may or may not be identical with each other, either $R_5$ or $R_6$ may represent hydrogen, and wherein $R_4$ and at least one of $R_5$ and $R_6$ represent a ballast group capable of preventing the substantial volatilization of the s-triazine from the photoresist composition, the ballast group being a substituted or unsubstituted alkyl group, or a substituted or unsubstituted aryl group, the substituted or unsubstituted alkyl group having at least 4 carbon atoms, the substituted or unsubstituted aryl group having at least 6 carbon atoms; $R_2$ and $R_3$ may or may not be identical with each other and each represent hydrogen, halogen, phenyl, a substituted or unsubstituted alkyl group, or an alkoxyl group; X and Y may or may not be identical with each other and each represent chlorine or bromine; and m and n may or may not be identical with each other and are each an integer of 0, 1, or 2. Desirable compositions will further comprise at least one photooxidizable leuco triarylmethane dye.

Accordingly, it is an object of the present invention to provide a light-sensitive composition suitable for use as a photoresist, the composition having incorporated therein a low-volatility, low "scum engendering" 2-phenyl-4,6-bis-(trichloromethyl)-1,3,5-triazine.

It is another object of the present invention to provide a light-sensitive composition suitable for use as a photoresist, the composition having incorporated therein a low-volatility, low "scum engendering" 2-phenyl-4,6-bis (trichloromethyl)-1,3,5-triazine, and a leuco triarylmethane dye.

It is another object of the present invention to provide a photocurable composition having incorporated therein a substituted 2-phenyl-4,6-bis (trichloromethyl)-1,3,5-triazine, the triazine characterized by a carbonyl functionality pendant the triazine's phenyl group.

It is another object of the present invention to provide a photocurable composition having incorporated therein a 2-phenyl-4,6-bis (trichloromethyl)-1,3,5-triazine, the triazine characterized by a carbonyl functionality pendant the triazine's phenyl group, and wherein the triazine is substituted with a ballast group capable of reducing volatilization of the s-triazine from the photocurable composition.

It is another object of the present invention to provide a photocurable composition having incorporated therein a 2-phenyl-4,6-bis (trichloromethyl)-1,3,5-triazine, the triazine characterized by a carbonyl functionality pendant the triazine's phenyl group, and wherein the triazine is substituted with a ballast group capable of reducing volatilization of the s-triazine from the photocurable composition, and wherein the s-triazine does not significantly absorb light at about λ>360 nm. even when it complexes with an electron-rich leuco triarylmethane dye.

It is another object of the present invention to provide a photoresist composition having incorporated therein 2-[p-(n-heptylaminocarbonyl)phenyl-4,6-bis (trichloromethyl)-1, 3,5-triazine.

It is another object of the present invention to provide a light-sensitive composition having good shelf-life characteristic and having reduced sensitivity to "scumming" by heat or room light exposure.

It is another object of the present invention to provide a lithographic printing plate having good thermal dark stability.

It is another object of the present invention to provide a lithographic printing plate having good photospeed.

It is another object of the present invention to provide a lithographic printing plate having good throughcure and durability.

It is another object of the present invention to provide a lithographic printing plate having good room light stability.

It is another object of the present invention to provide a lithographic printing plate capable of providing a high contrast visible image after exposure.

Other features and advantages of this invention will become apparent from the following detailed description of the presently preferred embodiments of the present invention taken in conjunction with the accompanying drawings.

DETAILED DESCRIPTION OF THE INVENTIVE SUBJECT MATTER

Throughout this disclosure the term "on-press" is used to describe both development and printing plates, (e.g. "on-press development", "developing on-press", "on-press developable lithographic printing plates", etc.) As used herein, the modifier "on-press" will be defined as indicating an ability to develop a useful imagewise distribution of oleophilic and hydrophobic polymeric areas on a printing press after imagewise exposure, without resort to wet development steps or like intermediary processing. "On-press" techniques should be contrasted with other so-called "dry development" techniques: e.g., dry collotype and laser ablation techniques, wherein oleophilic and hydrophobic image areas are formed at exposure; and peel-apart and thermal transfer techniques, wherein oleophilic and hydrophilic image areas are formed after a laminar separation.

Figure 1:
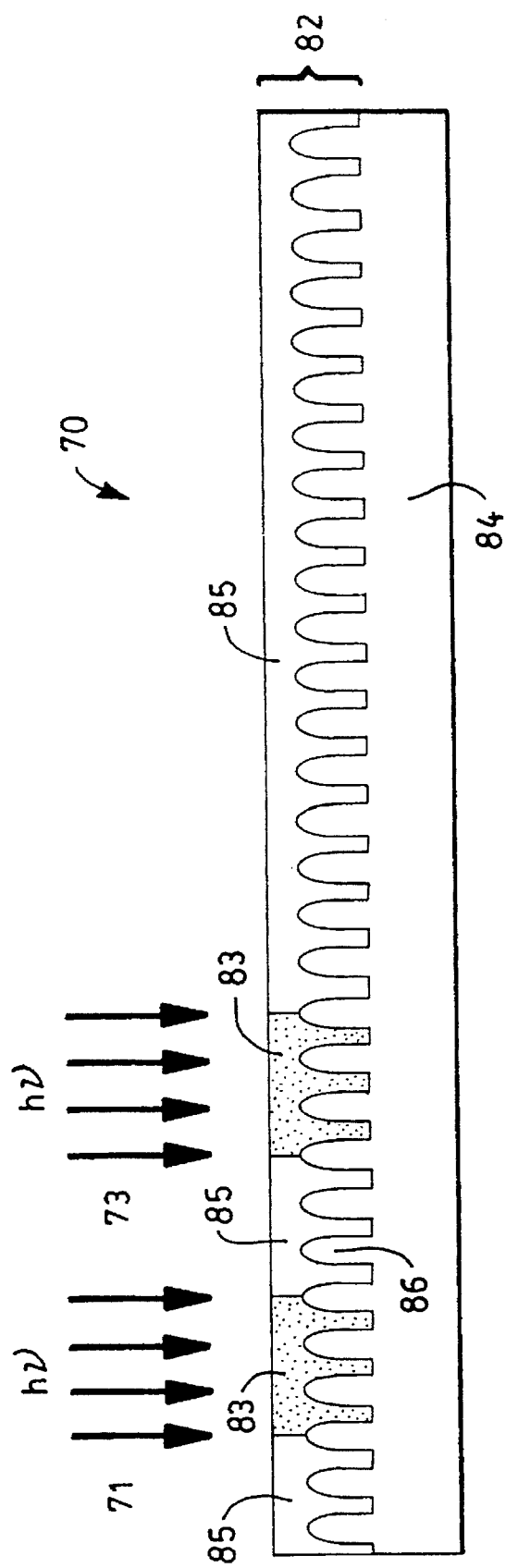
FIG. 1 schematically illustrates a cross-section of a lithographic printing plate 70 comprising a substrate 84 and a photoresist 82, the photoresist 82 being configured in accordance with the present invention.

One product embodiment of the present invention, lithographic printing plate 70, is schematically illustrated in FOG/heptylaminocarbonyl)phenyl-4,6-bis FIG. 1. As drawn (not to scale), printing plate 70 comprises a substrate 84 having deposited thereon a photoresist 85. In a use, plate 70 may be exposed to actinic radiation directly onto resist layer 82 to imagewise differentiate exposed areas 83 and unexposed areas 85. As a negative-working plate, areas 83 or 85 are photohardened by exposure. Development of plate 70 is typically accomplished by washing the plate with specific developers, organic solvents, surfactant solutions or sometimes with water or with fountain solution used in the printing arts. Washing can be effected by dipping, spraying or coating the plate with the washing fluid and by rinsing and drying the plate. Mechanical rubbing or brushing can be employed to assist development.

While the subject matter of the present invention was designed with consideration of the character of an on-press developable photoresist, it will be appreciated that the present invention extends broadly to the incorporation of a substituted 2-phenyl-4,6-bis(trichloromethyl)-1,3,5-triazine in photocurable compositions in general, particularly when a leuco triarylmethane dye is present. Accordingly, the present invention provides a photocurable composition comprising at least a photopolymerizable ethylenically unsaturated monomer having at least one terminal ethylenic group and capable of forming a polymer upon exposure to actinic radiation; and an s-triazine capable of initiating free radical polymerization of the photopolymerizable ethylenically unsaturated monomer and being represented by the following general formula:

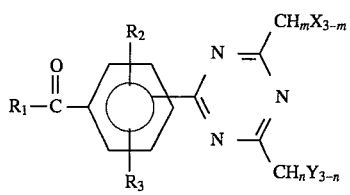

wherein $R_1$ is either $OR_4$ or $NR_5R_6$, wherein $R_5$ and $R_6$ may or may not be identical with each other, either $R_5$ or $R_6$ may represent hydrogen, and wherein $R_4$ and at least one of $R_5$ and $R_6$ represent a ballast group capable of preventing the substantial volatilization of the s-triazine from the photoresist composition, the ballast group being a substituted or unsubstituted alkyl group, or a substituted or unsubstituted aryl group, the substituted or unsubstituted alkyl group having at least 4 carbon atoms, the substituted or unsubstituted aryl group having at least 6 carbon atoms; $R_2$ and $R_3$ may or may not be identical with each other and each represent hydrogen, halogen, phenyl, a substituted or unsubstituted alkyl group, or an alkoxyl group; X and Y may or may not be identical with each other and each represent chlorine or bromine; and m and n may or may not be identical with each other and are each an integer of 0, 1, or 2.

Figure 2:
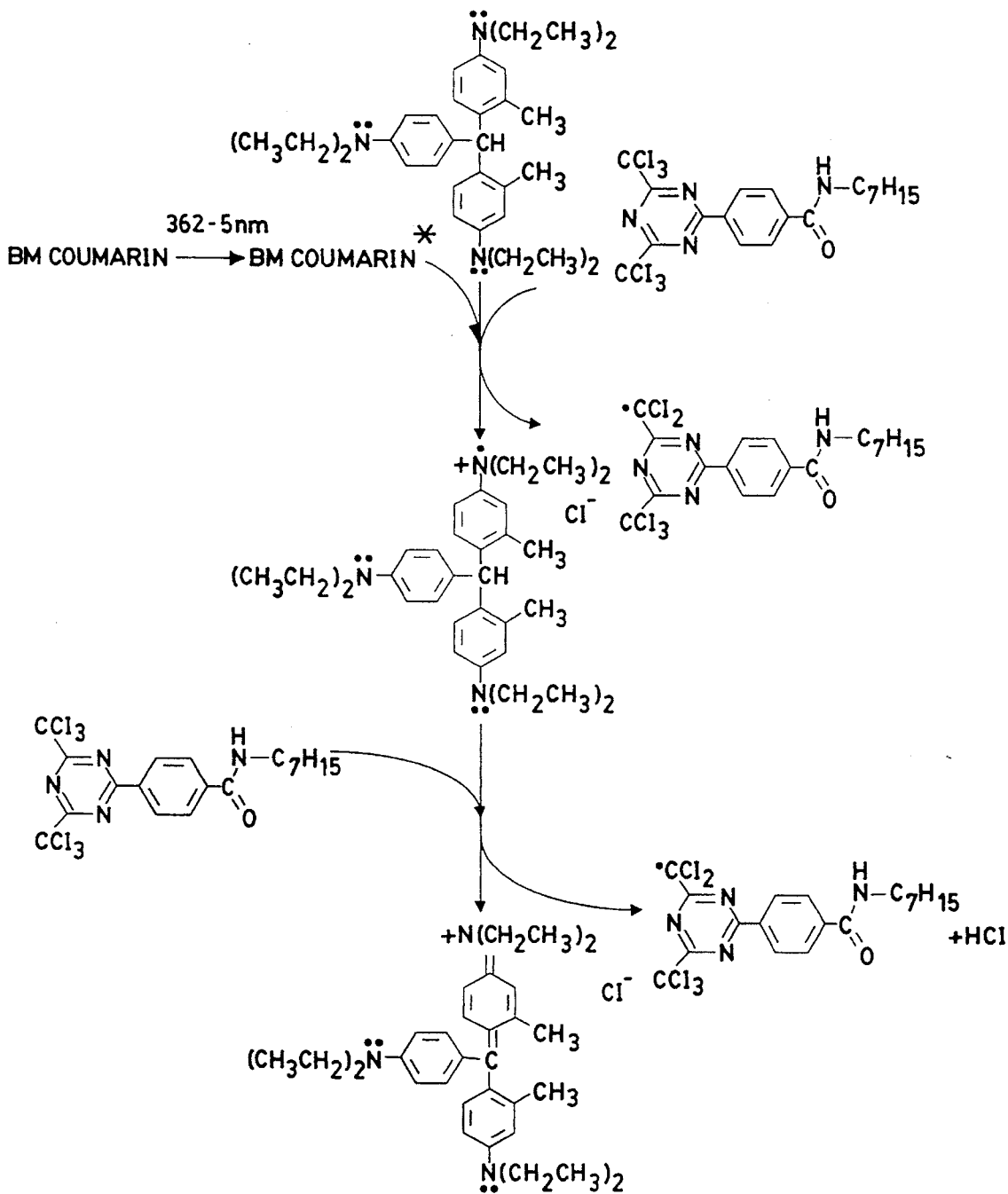
FIG. 2 shows the generation of free radicals in a free-radical initiating system upon exposure thereof to actinic radiation, the free-radical initiating system comprising 3-benzoyl-7-methoxy coumarin, bis(4-diethylamino-o-tolyl)-4-diethylamino-phenylmethane, and 2-[p-(n-heptylaminocarbonyl)phenyl-4,6-bis (trichloromethyl)-1,3,5-triazine.
Figure 3:
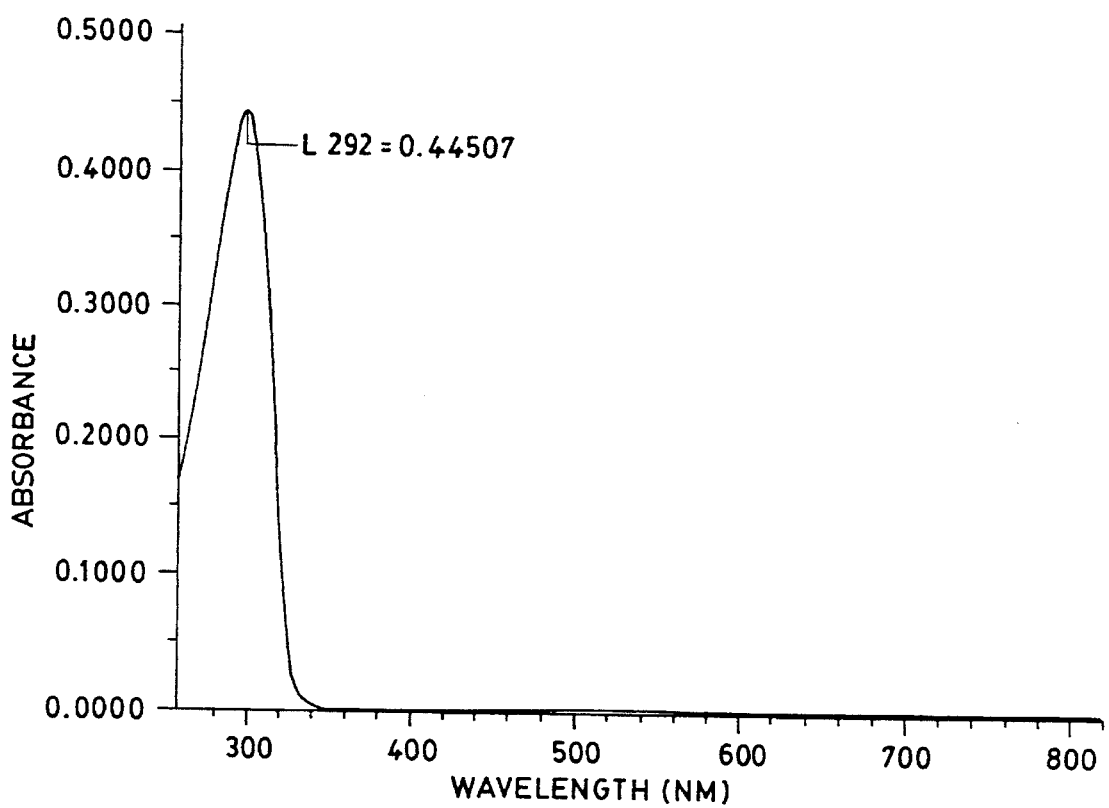
FIG. 3 shows a graph of the absorbance of the photooxidant dye 2-[p-(n-heptylaminocarbonyl)phenyl-4,6-bis (trichloromethyl)-1,3,5-triazine plotted against wavelength.
Figure 4:
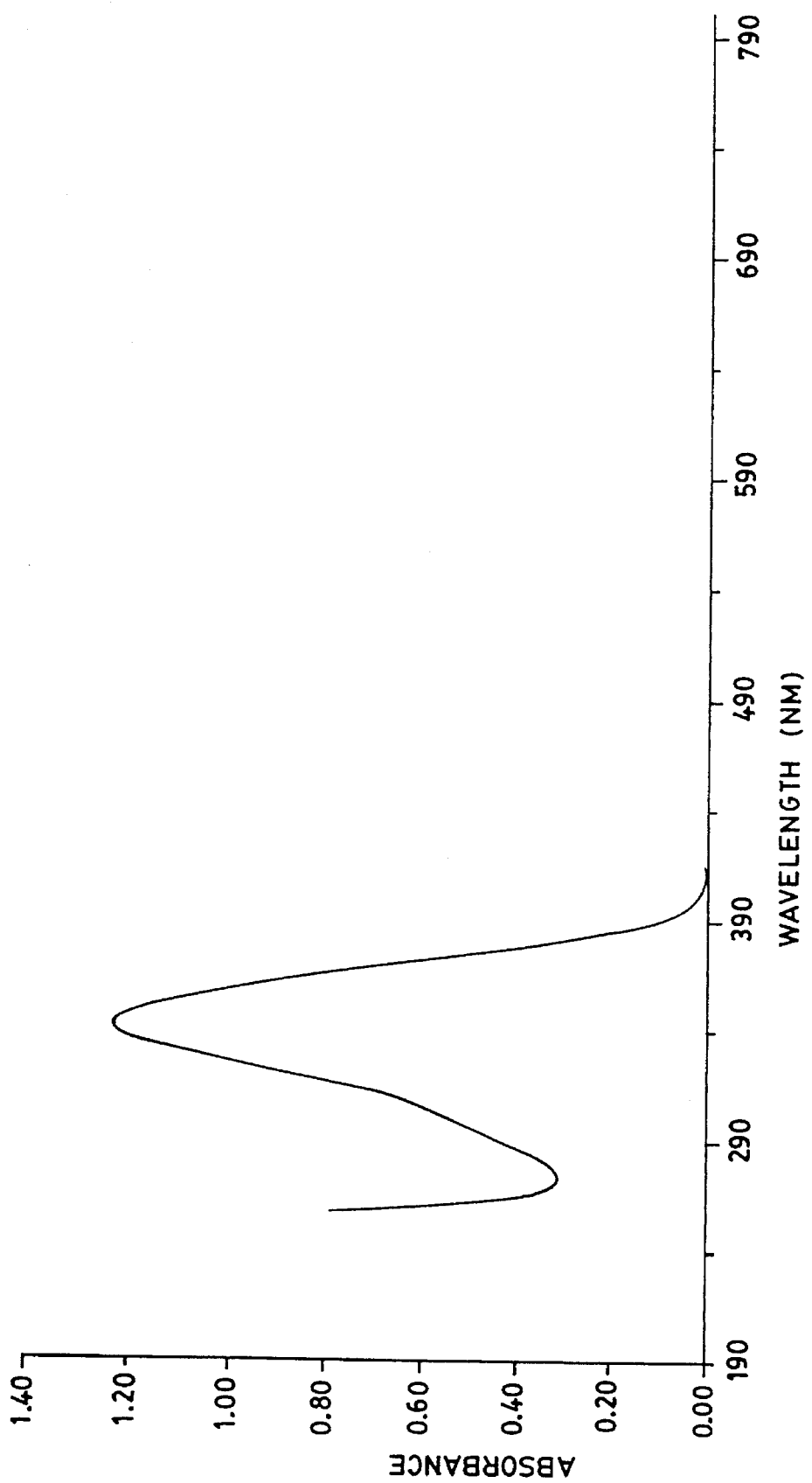
FIG. 4 shows a graph of the absorbance of 3-benzoyl-7-methoxy coumarin plotted against wavelength.

Desirable compositions will further comprise at least one photooxidizable leuco triarylmethane dye. Such dyes may be represented by the following formula:

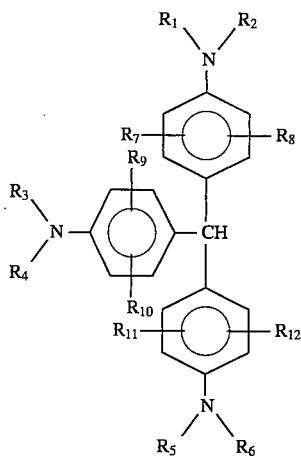

wherein $R_1$ to $R_6$ may or may not be identical with each other and each represent alkyl or aryl, and $R_7$ to $R_{12}$ may or may not be identical with each other and each represent H, alkyl, or aryl. A particularly preceded photooxidizable leuco triarylmethane dye is bis(4-diethylamino-o-tolyl(-4-diethylamino-phenylmethane, the structure of which is shown in FIG. 2.

While the present inventors do not with to be limited to any theory in explanation of their invention, with regard to the aforediscussed problems of room light stability and scumming, it is believed that due to the absence of strong electron donating groups attached immediately on the phenyl ring, better room light stability and less tendency to scum are effected. Strong electron donating groups or their precursors such as nitrogen, amino, or acylamino groups are not desirable because they, or their side products or isomers or degraded products, tend to shift the $\lambda_{max}$ of the triazine to longer wavelengths and increase the extinction coefficient. Also, they may form charge transfer complexes with the electron-deficient s-triazine ring and further reduce both the room light and thermal stability.

Due to the greater molecular weight of the ballast group, and the ability of the carbonyl group to form hydrogen bonds with other components of a photocurable composition (e.g., binders and monomers), the volatility of the s-triazine is greatly reduced. Little loss of photospeed and resolution upon aging would be observed.

In general, the ballast groups may be a substituted or unsubstituted alkyl group, or a substituted or unsubstituted aryl group, the substituted or unsubstituted alkyl group having at least 4 carbon atoms (preferably 5 to 12), the substituted or unsubstituted aryl group having at least 6 carbon atoms. In particular, to desirably accomplish a ballasting effect, several possible groups could be substituted onto the phenyl ring, for example, acetaminide group, carbamate, an extended aliphatic group, or a group capable of hydrogen bonding with the matrix of a photoresist, preferably a hydrogen bond donating group. The hydrogen bond donating group may be amide, carbamate, and the like.

As previously emphasized, it is a desirable goal of the present invention to design the s-triazine such that it would have negligible or no light absorption at about $\lambda > 360$ nm. Such goal may be accomplished by selecting a ballast group that would not significantly increase the conjugation of the s-triazine.

The s-triazine of the present invention is effective in amounts of from about 0.05 to 20% by weight, with amounts in the range from 0.5% to 5% by weight being particularly preferred. Photosensitizers may be used, for example, to extend spectral sensitivity. Multifunctional monomers may be used to increase the degree of crosslinking. Suitable functionalities of the multifunctional monomers which can be photopolymerized are acrylates, methacrylates, vinyl esters, and vinylamides. These are described in greater detail below.

The compounds of the present invention are also capable of causing color changes in colored systems during photolysis or of initiating color formation of leuco dyes, such as leuco triarylmethane dyes. Color changes are of particular importance in on-press developable lithographic plates because they make it possible for the plates to be examined before they are printed on-press.

Regardless of the method of preparation, photoresists based on free-radical mechanisms typically comprise a binder component, a polymerizable monomer component, and an initiator.

The polymerizable monomer component may include any variety of compounds, mixtures, or mixtures of reaction compounds or materials capable of being physically altered by photoexposure or of promoting physical alteration (e.g. solubilization or hardening) of the properties of the layer in areas of photoexposure. Compounds and materials suitable for this purpose include monomeric photopolymerizable compounds which undergo free-radical or cation-initiated addition polymerization. A large number of useful compounds is available, generally characterized by a plurality of terminal ethylenic groups.

Especially preferred for promoting photohardening of polymeric resist layer is a polymerizable monomer which forms a macromolecular or polymeric material upon photoexposure, preferably a photopolymerizable ethylenically unsaturated monomer having at least one terminal ethylenic group capable of forming a high polymer by free-radical initiated, chain-propagated addition polymerization. Examples of such unsaturated compounds include acrylates, acrylamides, methacrylates, methacrylamides, allyl compounds, vinyl ethers, vinyl esters, N-vinyl compounds, styrene, crotonates and the like. Polymerization can be effected by using a photoinitiator, such as a free-radical generating, addition polymerization-initiating system activatable by actinic radiation. Such initiating systems are known and examples thereof are described below.

Preferred polymerizable monomers are the polyfunctional acrylate monomers such as the acrylate and methacrylate esters of ethylene glycol, trimethylolpropane and pentaerythritol. These can be polymerized in exposed regions of a polymeric photoresist in the presence of a photosensitizer or addition photoinitiator. Suitable photosensitizers or photoinitiators include the derivatives of acetophenone (such as 2,2-dimethoxy-2-phenylacetophenone), benzophenone, benzil, ketocoumarin (such as 3-benzoyl-7-methoxy coumarin), xanthone, thioxanthone, benzoin or an alkyl-substituted anthraquinone, diaryl iodonium salt, triaryl sulfonium salts, azobisisobutyronitrile and azo-bis-4-cyano-pentoic acid, although others can be employed.

The practical concentration of the monomer or monomers employed is about 7.5%–70% by weight based on the total solids of the composition, and preferably between 15–50%.

In contrast to the comparatively lower preferred concentrations of photosensitive monomer, the principal component of the polymeric photoresist for most plates is a hydrophobic binder of suitable oleophilicity and ink receptivity. Suitable binder materials include: vinylidene chloride copolymers; ethylene/vinyl acetate copolymers; cellulose esters and ethers (e.g., cellulose acetate butyrate, cellulose acetate propionate, and methyl, ethyl benzyl cellulose); polystyrene copolymers; synthetic rubbers (e.g., butadiene/acrylonitrile copolymers; chlorinated isoprene and 2-chloro-1,3-butadiene polymers); polyvinylacetate copolymers (e.g., vinyl acetate/acrylate copolymers); poly(vinyl acetate) and vinyl acetate/methylmethacrylate copolymers); acrylate and methacrylate copolymers; vinyl chloride copolymers; and diazo resins such as the formaldehyde condensates of p-diazodiphenylamine, and their copolymers.

The photoresist systems of the present invention can be suitably coated into a layer which, upon photoexposure, undergoes hardening as the result of polymerization of the polymerizable monomer and grafting of the monomer onto the polymeric binder. If desired, other crosslinking agents, such as bis-azides and polythiols, can be included to promote crosslinking of the polymerizable monomers or the binders.

If desired, preformed polymers having pendant pyridium ylide groups, which groups, upon photoexposure, undergo ring expansion (photorearrangement) to a diazepine group with accompanying insolubilization can also be blended with the photoreactive polymer of this invention. Examples of polymers having such pyridium ylide groups are set forth in U.S. Pat. No. 4,670,528, issued to L. D. Taylor and M. K. Haubs on Jun. 2, 1987.

To prepare a lithographic plate according to the present invention, the photoresist system is coated as a layer onto a substrate. Certain factors are considered in determining the appropriate materials for the substrate. Such factors vary with the particular lithographic needs of individual projects and are believed to be within the grasp of one skilled in the pertinent art. Regardless, for most lithographic needs envisioned, suitable substrates will generally include those to which the polymeric resist layer can be adhered adequately, prior to photoexposure, and to which photoexposed printing (image) areas are adhered after photoexposure. Other pertinent considerations may be extrapolated on the basis of the present disclosure.

In practice, substrate materials for use in the manufacture of printing plates will oftentimes be subjected to one or more treatments in order to improve adhesion of the photoresist, or to increase the hydrophilic properties of the substrate material, and/or to improve the developability of the photosensitive coating, as is described in the U.S. Pat. No. 4,492,616 (issued Jan. 8, 1985 to E. Pliefke, et al.). Thus, the substrates will typically be treated (for example, by polyvinylphosphonic acid or silicate or by anodization, or by corona discharge or plasma treatment, or by toughening or graining treatment) to promote desired adhesion of any polymeric resist layers.

Especially preferred substrates are the metallic substrates of aluminum, zinc, steel or copper. These include the known bi-metal and tri-metal plates such as aluminum plates having a copper or chromium layer; copper plates having a chromium layer; steel plates having copper or chromium layers; and aluminum alloy plates having a cladding of pure aluminum. Other preferred substrates are silicone rubbers and metallized plastic sheets such as poly(ethylene terephthalate).

Preferred plates are the grained, anodized aluminum plates, where the surface of the plate is roughened mechanically or chemically (e.g., electrochemically) by a combination of roughening treatments. Anodized plates can be used to provide an oxide surface. Still more preferred plates are anodized aluminum plates which, for example, have been treated with polyvinylphosphonic acid or otherwise provided with a resinous or polymeric hydrophilic layer.

Examples of printing plate substrate materials which can be used in the production of printing plates of the invention, and methods of graining and hydrophilizing such substrates are described, for example, in U.S. Pat. No. 4,153,461 (issued May 8, 1979 to G. Berghäuser, et al.); the aforementioned U.S. Pat. No. 4,492,616 issued to E. Pliefke, et al; U.S. Pat. No. 4,618,405 (issued Oct. 21, 1986 to D. Mohr, et al.); U.S. Pat. No. 4,619,742 (issued Oct. 28, 1986 to E. Pliefke); and U.S. Pat. No. 4,661,219 (issued Apr. 28, 1987 to E. Pliefki).

It is common practice in preparing photoresist compositions to employ photosensitizers, coinitiators, and activators. Photosensitizers and coinitiators are relied upon to capture photons of exposing radiation. They may absorb light of different wavelengths from the principal photoinitiator. The activator in contrast is not relied upon to respond directly to exposing radiation, but rather adjacent activator and photosensitizer molecules react, following excitation of the latter by photon capture, causing release of a free radical which in turn induces immobilization addition reactions at sites of ethylenic unsaturation.

Photoexposure of the printing plates can be accomplished according to the requirements dictated by the particular composition of the polymeric photoresist and the thickness thereof. In general, actinic irradiation from conventional sources can be used for photoexposure, for example, relatively long wavelength ultra, violet irradiation or visible irradiation. UV sources will be especially preferred and include carbon arc lamps, "D" bulbs, Xenon lamps and high pressure mercury lamps.

The thickness of the photoresist can vary with the particular requirements. In general, it should be of sufficient thickness to provide a durable photohardened printing surface. Thickness should be controlled, however, such that it can be exposed within exposure-time requirements and should not be applied at a thickness that hampers ready removal of the layer in exposed (or non-exposed) areas by developers. When utilizing an anodized, grained aluminum substrate, good results are obtained by using a polymeric photoresist having a coverage in the range of from about 50–200 mg/ft$^2$, preferably about 80–150 mg/ft$^2$.

A polymeric photoresist can be provided with colorants, e.g., tint dyes, to provide a desired and predetermined visual appearance. Especially preferred will be a colorant, or a precursor of a species, respectively, capable either of being rendered colorless, or being provided with coloration by the irradiation of the plate-making photoexposure step. Such dye or dye-precursor compounds and the light absorption differences promoted by the photoexposure allow the plate-maker to distinguish readily the exposed from the non-exposed regions of the plate in advance of mounting and running the photoexposed plate on a printing press.

In addition, the operability of the polymeric photoresist may be improved by the addition of certain additives. For example, the polymeric photoresist can contain plasticizers, surfactants, particulates, or other agents to improve coatability. The polymeric photoresist may also contain antioxidant materials to prevent undesired (premature) thermal polymerization and examples include derivatives of hydroquinone; methoxy hydroquinone; 2,6-di-(t-butyl)-4-methylphenol; 2,2'-methylene-bis-(4-methyl-6-t-butylphenol); tetrakis {methylene-3-(3',5'-di-t-butyl-4'-hydroxyphenyl)propionate}methane; diesters of thiodipropionic acid, triarylphosphite. While the use of such additives is unnecessary for the operability of the present invention, incorporation of such additives may dramatically enhance performance.

The plasticizers, contrast dyes, imaging dyes and other additives may be microencapsulated and incorporated into the photoresist itself or a separate layer facially positioned or positionable atop the photoresist. In some cases, inclusion in the microcapsules would provides a wider latitude in the selection of such additives, since neither the solubility of the additives in the photopolymerizable compositions nor the inhibition or retardation effect of some additives on polymerization would be an issue in such a system.

Development of a photoexposed plate of the invention can be accomplished in a number of ways, depending upon the particular nature of the photoresist employed. For example, in the case of a negative-working photoresist based upon photopolymerizable ethylenically unsaturated monomers, conventional wet development can be employed using a diluted alkaline solution containing preferably up to 20% by volume of organic solvents. Examples of useful alkaline compounds include inorganic compounds such as sodium hydroxide, potassium hydroxide, lithium hydroxide, sodium benzoate, sodium silicate and sodium bicarbonate; and organic compounds such as ammonia, monoethanolamine, diethanolamine and triethanoloamine. Water-soluble organic solvents useful as developers include isopropyl alcohol, benzyl alcohol, ethyl cellosolve, butyl cellosolve, diacetone alcohol and the like. Depending on the particular needs, the developing solution may contain surfactants, dyes, water soluble polymers, salts for inhibiting the swelling of the photoresist, or salts for corroding the metal substrate.

As another means of development, it is noted that embodiments of the present invention may be operably on-press developed without any further treatment after exposure, development being accomplished on the printing press by the action of fountain solution and lithographic ink. On-press developable plates of the invention can be improved in respect of on-press developability by suitably modifying the photoresist composition or treating the photoresist layer for improved removability on the press. For example, good results may be accomplished using the s-triazines of the present invention in a photoresist that is in contact or brought into contact with the microencapsulated developer systems described in U.S. patent Ser. No. 08/146,710, cross-referenced above. The photoresist may also incorporate a plasticizing system, a dispersed rubber system, and a photoreactive polymeric binder, as described in the above cross-referenced U.S. patent application Ser. Nos. 08/146,479; 08/147,044; 08/147,045; and 08/146,711.

The present invention will now be described in further detail by the following non-limiting examples of several of its embodiments. Unless otherwise indicated, all parts, percents, ratios and the like are by weight.

EXAMPLES

Preparation of Control Photoresist Formulation

Photoresist formulations are made from the following baseline formulation.

| Component | % (w/w) |
|---|---|
| Photoreactive Acrylic Binder[α] | 51.75 |
| Hexafunctional urethane acrylate (Ebecryl 8301 from Radcure) | 17.03 |
| Trimethylolpropane triacrylate | 7.57 |
| Polyurethane PU788 (from Morton) | 4.48 |
| Acrylated Nitrile Butadiene (Hycar 1300x33, Goodrich) | 4.00 |
| 3-benzoyl-7-methoxy coumarin[β] | 1.40 |
| 4-benzoyl-4-methyl diphenyl sulfide[β] (Quantacure BMS) | 1.80 |
| 2-phenyl-4,6-bis-(trichloromethyl-5-triazine)[δ] | 2.20 |
| Triethylene glycol diacetate | 3.50 |
| Leuco Crystal Violet Dye | 2.77 |
| 2,6-di-tert-butyl-4-methyl phenol (BHT)[χ] | 0.41 |
| Pluronic L43 Surfactant (from BASF) | 2.50 |

Notes:
[α]: The photoreactive binder contained methyl methacrylate, butyl methacrylate, maleic anhydride, and an m-TMI adduct with hydroxybutyl acrylate (See, U.S. Pat. Apps. Ser. Nos. 08/147,045 and 08/146,711);
[β]: Radical initiator;
[χ]: Antioxidant;
[δ]: oxidizing agent-radical initiator.

The formulation is used as a control in the following studies. Formulations and coating experiments are performed under blue and UV filtering safelights to avoid premature exposure. The formulation is prepared as a 7% solution in a mixture of organic solvents comprising 310.98 parts MEK, 22.32 parts toluene, 21.6 parts n-butanol, and 14.88 parts cyclohexanone. The mixture is spin coated at 200 rpm onto a lithographic aluminum substrate (from Hoechst). The coating is dried at 70° C. for 3 minutes, then stored in the dark overnight prior to testing.

Subsequently, the plates are exposed to ultraviolet radiation from a Teaneck vacuum exposure frame using a light source having an emission maximum in the UV at approximately 363 nm and several peaks in the blue region of the visible spectrum. The plate is covered with a mask having a 21-step, 3 step/stop wedge, and a UGRA standard graphic arts evaluation target. The plates are generally given an exposure series of 5, 10, 20, 40, and 80 light units (LU), one light unit being measured by the integrator on the exposure unit to deliver a constant amount of energy (about 5 mj/cm$^2$). The plates are conventionally developed with du Pont Howson Super Marathon developer, coated with a protective asphaltic gum, and stored. "On press" evaluation is done with a MultiGraphics business form press. The plates were run from 100 to 1000 impressions, depending on the object of the test.

BACKGROUND EXAMPLE 1A

Several studies are performed to confirm the hypothesis that triazine evaporation is responsible for the resolution and photospeed loss in the imaging system. In one study, the control formulation is coated onto polyester at aim thicknesses of 4.5 μm and 9 μm. The samples are aged for 7.5, 25.5 and 50.6 hours at 60° C. The dye maximum at 80 LU is read and the percent loss of density from the initial sample is calculated. Whereas the 4.5 μm coating loses 76% of its total density after 50.6 hours, the 9 μm coating loses only 42%. The experiment is then repeated at 9 and 10 μm coatings on a lithographic aluminum substrate. The data is presented in Table 1A-1.

TABLE 1A-1

Photospeed Loss Rate v. Layer Thickness

| Substrate | Thickness (aim) | Pre-exposure: 7.5 h @ 60° C. | Pre-exposure: 25.5 h @ 60° C. | Pre-exposure: 50.6 h @ 60° C. |
|---|---|---|---|---|
| PET | 4.5 μm | −17% | −36% | −76% |
| PET | 9 μm | −0% | −10% | −42% |
| Litho. Al. | 9 μm | −4% | 0% | −54% |
| Litho. Al. | 10 μm | −4% | −1% | −34% |

From the data it may be concluded that volatilization is responsible for photospeed loss with the lithographic aluminum substrate having little or no effect on loss rate.

BACKGROUND EXAMPLE 1B and 1C

In another set of examples (Example 1B), two higher molecular weight triazines, 2-(o-chlorophenyl) and 2-(p-methoxystyryl)-4,6-bis (trichloromethyl)-s-triazine, are evaluated in the control formulation. The results of this study indicate that the higher molecular weight (and accordingly less volatile) triazines exhibit less dye density loss than the control compound. The supporting data is presented in Table 1B-1.

TABLE 1B-1

Photospeed Loss vs. Triazine Molecular Weight

| Substituent | Mw (g/mol) | $D_{max}$ (80 LU); RT | $D_{max}$ (80 LU); 60° C. | Loss |
|---|---|---|---|---|
| 2-phenyl (Control) | 391.90 | 1.13 | 0.66 | −0.47 |
| 2-(o-chlorophenyl) | 426.30 | 1.13 | 0.85 | −0.28 |
| 2-(p-methoxystyryl) | 448.00 | 1.13 | 0.85 | −0.28 |

In another set of examples (Example 1C), an experiment is performed in which a 5% triazine solution is coated on a plate onto which a 5% triazine solution was previously coated and aged until the photoresponse was completely suppressed. The coating weight is chosen to deliver 60 micrograms per square centimeter, i.e., about the same amount of triazine as in a fresh coating. When the recoated plate is exposed, the dye density increased from 0.54 to 0.98, i.e., close to the original dye density.

EXAMPLE 2A: COMPARATIVE EXAMPLE 2B

A photosensitive lithographic printing plate comprising a photoresist is deposited on an anodized aluminum substrate. The photoresist (used @5.50% coating solution) is formulated as shown in the following Table 2AB-1.

TABLE 2AB-1

Preparation of Photoresist Formulation (700 g. Batch)

| Component | % of Stock Solution | % in Dry Film | Gms. Stock Solution |
|---|---|---|---|
| Photoreactive Acrylic Binder[α] | 49.6 | 51.75 | 51.12 |
| Ebecryl 8301 Oligomer (from Radcure) | 20 | 17.36 | 42.54 |
| Polyurethane 788 (from Morton) | 20 | 4.67 | 11.44 |
| Trimethylolpropane triacrylate, TMPTA | 20 | 7.72 | 18.91 |
| Rubber | 20.00 | 4.00 | 9.80 |
| 4,4-bis(diethylamino)benzophenone | 5 | 0.40 | 3.92 |
| 4-benzoyl-4-methyl diphenyl sulfide | 3 | 2.00 | 32.67 |
| s-triazine (varied for Ex. 2A & 2B; see below) | 5 | 2.50 | 24.50 |
| Pluronic L43 Surfactant (from BASF) | 20 | 2.50 | 6.13 |
| Triethylene glycol diacetate | 20 | 3.50 | 8.58 |
| Toluene | | | 39.06 |
| Methyl Ethyl Ketone | | | 373.04 |
| Cyclohexanone | | | 26.04 |
| Leuco Crystal Violet Dye | 3 | 3.20 | |
| 2,6-di-tert-butyl-4-methyl phenol (BHT) | .22 | .23 | |
| Irganox 1035 (antioxidant from Ciba-Geigy) | 0.155 | 0.17 | |
| TOTAL | 100.00 | | 700.00 |
| TOTAL SOLIDS (%) | | | 49.00 |
| TOTAL SOLVENTS (%) | | | 651.00 |

Notes:
[α]: The photoreactive acrylic binder contains methyl methacrylate, butyl methacrylate, maleic anhydride, and TMI adduct with hydroxybutyl acrylate. See, U.S. Pat. App. Ser. No. 08/147,045 and 08/146,711.

For Example 2A, the above formulation used 2-[p-(n-heptylaminocarbonyl)phenyl-4,6-bis (trichloromethyl)-1,3,5-triazine (λ-max: 292 nm; MW: 533), which has the formula:

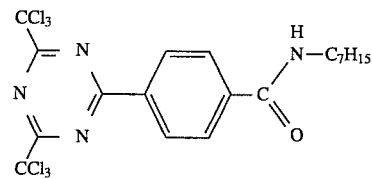

For Comparative Example 2B, the above formulation used the isomer of the s-Triazine in Example 2A, and which has the formula:

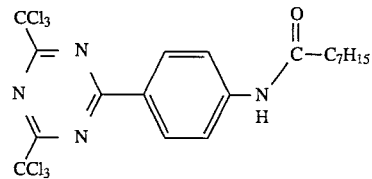

Two small plates are coated and cut in half, with one side cut into quarters. One quarter is placed in an oven for 24 hours at 60° C. while the other sat at room temperature for 24 hours. The plates are exposed at 40 and 80 light units (LU). The plates are mounted on a Multigraphics Form printing press, subjected to 20 revolutions with fountain solution, then 10 more revolutions with fountain solution and ink, then ran in standard printing operation. Observations are tabulated as follows.

| Observations | Plate 2A | Plate 2B |
| --- | --- | --- |
| Dye Density @ RT/24 hrs./40 LU | 1.07 | 1.05 |
| Dye Density @ 60° C./24 hours/40 LU | .94 | .83 |
| Dye Density @ RT/24 hrs./80 LU | 1.13 | 1.08 |
| Dye Density @ 60° C./24 hrs./80 LU | 1.01 | .89 |
| Dye $D_{min}$, RT | .44 | .44 |
| Dye $D_{min}$, 60° C. | .59 | .48 |
| RT Solid Step Number at 40 LU | 4 | 3 |
| 60° C. Solid Step Number at 40 LU | 4 | 2 |

As observed, the plate of Comparative Example 2B scummed significantly after 60° C., thus resulting in an inferior plate. While the present inventors do not wish to be bound to any theory in explanation of this unexpected result, it is believed that such may be attributed to the side products or isomers from a "rearrange" reaction or the thermo- or the photo- degraded products of s-triazine in Example 2B.

EXAMPLE 3A AND COMPARATIVE EXAMPLES 3B–3C

EXAMPLE 3A

A photosensitive lithographic printing plate comprising a photoresist is deposited on an anodized aluminum substrate. The photoresist (used @5.50% coating solution), containing s-triazine, i.e., 2-[p-(n-heptylaminocarbonyl)phenyl-4,6-bis (trichloromethyl)-1,3,5-triazine (λ-max: 292 nm; MW: 533), is formulated as shown in the following Table 3A-1.

TABLE 3A-1

| Preparation of Photoresist Formulation (420 g. Batch) | | | |
| --- | --- | --- | --- |
| Component | % of Stock Solution | % in Dry Film | Gms. Stock Solution |
| Acryloid Resin A-11 (from Rohm and Haas) | 20 | 6.50 | 7.51 |
| Acryloid Resin B-72 (from Rohm and Haas) | 20 | 14.00 | 16.17 |
| Photoreactive Acrylic Binder[α] | 20 | 10.00 | 11.55 |
| Ebecryl 8301 Oligomer (from Radcure) | 20 | 7.00 | 8.09 |
| Dipentaerythritol pentaacrylate (Sartomer SR399) | 20 | 48.05 | 55.49 |
| 3-benzoyl-7-methoxy coumarin (BMC) | 2 | 1.40 | 16.17 |
| 4-benzoyl-4-methyl diphenyl sulfide | 3 | 1.80 | 13.86 |
| s-triazine (See, below.) | 5 | 2.50 | 11.55 |
| Pluronic L43 Surfactant (from BASF) | 20 | 4.80 | 5.54 |
| Methyl Ethyl Ketone | | | 208.97 |
| Cyclohexanone | | | 39.69 |
| Bis OMLEV/BHT/1035 | 3.595 | 3.95 | 25.41 |
| Bis OMLEV[β] | 3 | 3.30 | |
| 2,6-di-tert-butyl-4-methyl phenol (BHT) | 0.44 | 0.48 | |
| Irganox 1035 | 0.155 | 0.17 | |
| (antioxidant from Ciba-Geigy) | | | |
| TOTAL | | 100.00 | 420.00 |
| TOTAL SOLIDS | | | 23.10 |
| TOTAL SOLVENTS | | | 396.90 |

Notes:
[α]: The photoreactive acrylic binder contains methyl methacrylate, butyl methacrylate, maleic anhydride, and TMI adduct with hydroxybutyl acrylate. See, U.S. Pat. App. Ser. No. 08/147,045; and U.S. Pat. App. Att'y Dkt. No. C8024, filed on April 27, 1995;
[β]: bis (4-diethylamino-o-tolyl)-4-diethylamino-phenylmethane.

A photoresist composition with BMC content reduced by half is also prepared.

Generally, a coated plate is exposed to actinic radiation from a standard mercury halide lamp, the lamp having an emission peak in the ultraviolet range of 360 nm. The plate is exposed through a UGRA target mask at 10, 15, 20, and 25 light units (LU) to produce a test image. The plate is mounted on a Multigraphics Form printing press, subjected to 20 revolutions with fountain solution, then 10 more revolutions with fountain solution and ink, and then run in standard printing operation.

COMPARATIVE EXAMPLE 3B

A photoresist composition similar to photoresist composition was prepared. However, TAZ 106 (λ-max: 380 nm; MW: 472), a triazine of the structure,

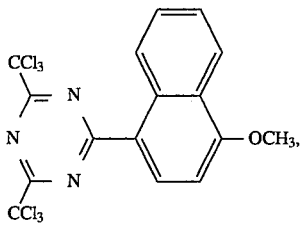

is used instead of 2-[p-(n-heptylaminocarbonyl)phenyl-4,6-bis(trichloromethyl)-3,5-triazine. A photoresist composition with BMC content reduced by half is also prepared.

COMPARATIVE EXAMPLE 3C

A photoresist composition similar to photoresist composition was prepared. However, TAZ 114 (λ-max: 396 nm; MW: 478), a triazine of the structure,

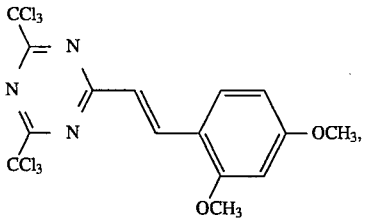

is used instead of 2-[p-(n-heptylaminocarbonyl)phenyl-4,6-bis(trichloromethyl)-1,3,5-triazine. A photoresist composition with BMC content reduced by half is also prepared.

EVALUATION

Thermogravimetric analysis of the triazines suggest that Taz 106 and Taz 114 may have usefully low volatility. However, their UV absorptions ($\lambda_{max}$: 380 and 398, respectively) are further into the visible than the s-triazine. Accordingly, it is believed that their complexes with leuco dye would absorb in the visible range of fluorescent, pressroom light, thus effecting inferior room light stability. This is demonstrated in the following table.

| Time (hrs.) | $D_{min}$: (B)lack (C)yan | Ex. 3A | Ex. 3A ½ BMC | Ex. 3B | Ex. 3B ½ BMC | Ex. 3C | Ex. 3C ½ BMC |
| --- | --- | --- | --- | --- | --- | --- | --- |
| 0.0 | B | .59 | .59 | .59 | .59 | .59 | .59 |
|  | C | .59 | .59 | .59 | .59 | .60 | .60 |
| 0.5 | B | .61 | .61 | .67 | .68 | .80 | .79 |
|  | C | .64 | .63 | .75 | .75 | .98 | .96 |

-continued

| Time (hrs.) | $D_{min}$: (B)lack (C)yan | Ex. 3A | Ex. 3A ½ BMC | Ex. 3B | Ex. 3B ½ BMC | Ex. 3C | Ex. 3C ½ BMC |
|---|---|---|---|---|---|---|---|
| 1.0 | B | .63 | .62 | .69 | .70 | .82 | .81 |
|  | C | .67 | .65 | .81 | .82 | 1.03 | 1.01 |
| 1.5 | B | .64 | .63 | .71 | .72 | .83 | .82 |
|  | C | .68 | .66 | .82 | .83 | 1.04 | 1.02 |
| 2.5 | B | .64 | .63 | .71 | .72 | 1.07 | 1.04 |
|  | C | .69 | .66 | .82 | .84 | 1.07 | 1.04 |
| 3.0 | B | .64 | .64 | .71 | .72 | 1.07 | 1.05 |
|  | C | .69 | .67 | .83 | .84 | 1.07 | 1.05 |
| 3.5 | B | .64 | .63 | .71 | .72 | .83 | .82 |
|  | C | .69 | .67 | .83 | .84 | 1.07 | 1.04 |
| 4.5 | B | .66 | .65 | .92 | .91 | .84 | .84 |
|  | C | .73 | .69 | .91 | .93 | 1.08 | 1.05 |
| 23.5 | B | .68 | .66 | .77 | .77 | .85 | .84 |
|  | C | .74 | .72 | .93 | .94 | 1.09 | 1.08 |

As shown in the table, plate formulations containing Taz 106 (Comparative Example 3B) or Taz 114 (Comparative Example 3C), upon exposure to press room light, showed a $D_{min}$ increase greater than those containing s-triazine of Example 3A. It is further shown that reducing the photosensitizer level has no effect on $D_{min}$ stability in the case of Comparative Examples 3B and 3C.

We claim:

1. A photocurable composition comprising at least a photopolymerizable ethylenically unsaturated monomer having at least one terminal ethylenic group and capable of forming a polymer upon exposure to actinic radiation;

a photooxidizable leuco triarylmethane dye; and an s-triazine capable of initiating free radical polymerization of the photopolymerizable ethylenically unsaturated monomer and being represented by the following general formula:

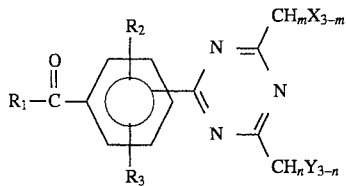

wherein $R_1$ is either $OR_4$ or $NR_5R_6$, and wherein $R_4$ and at least one of $R_5$ and $R_6$ represent a ballast group, $R_5$ and $R_6$ being hydrogen when not said ballast group, said ballast group being a substituted or unsubstituted alkyl group, or a substituted or unsubstituted aryl group, the substituted or unsubstituted alkyl group having at least 4 carbon atoms, the substituted or unsubstituted aryl group having at least 6 carbon atoms;

$R_2$ and $R_3$ are different or identical with each other and each represent hydrogen, halogen, phenyl, a substituted or unsubstituted alkyl group, or an alkoxyl group;

X and Y are different or identical with each other and each represent chlorine or bromine; and m and n are different or identical with each other and are each an integer of 0, 1, or 2.

2. The photocurable composition of claim 1, wherein $R_1$ is $NR_5R_6$, and wherein $R_2$, $R_3$ and $R_5$ are hydrogen, X and Y are both chlorine, m and n are both 0, and $R_6$ represent a substituted or unsubstituted alkyl group having at least 4 carbon atoms.

3. The photocurable composition of claim 1, wherein the s-triazine is a 2-[p-(alkylaminocarbonyl)phenyl-4,6-bis(halomethyl)-1,3,5-triazine.

4. The photocurable composition of claim 3, wherein the s-triazine is 2-[p-(n-heptylaminocarbonyl)phenyl-4,6-bis-(trichloromethyl)-1,3,5-triazine.

5. The photocurable composition of claim 1, wherein the selected ballast group does not substantially increase the conjugation of the s-triazine.

6. The photocurable composition of claim 3, wherein the composition is configured to be optimally photocurable at a predetermined wavelength, the s-triazine being substantially non-responsive to said predetermined wavelength, the photocurable composition further comprising a photosensitizer, the photosensitizer capable of activating the s-triazine, the photosensitizer capable of being activated by exposure to radiation of said predetermined wavelength.

7. The photocurable composition of claim 5, wherein the photosensitizer is 3-benzoyl-7-methoxycoumarin.

8. The photocurable composition of claim 1, wherein the photooxidizable leuco triarylmethane dye is

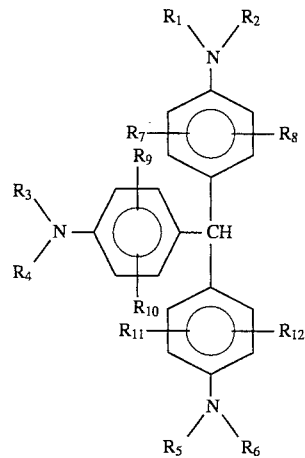

wherein $R_1$ to $R_6$ may or may not be identical with each other and each represent alkyl or aryl, and $R_7$ to $R_{12}$ may or may not be identical with each other and each represent H, alkyl, or aryl.

9. The photocurable composition of claim 8, wherein the photooxidizable leuco triarylmethane dye is bis(4-diethylamono-o-tolyl)-4-diethylamino-phenylmethane.

10. The photocurable composition of claim 1, wherein a complex formed by the s-triazine and the leuco triarylmethane dye is substantially non-responsive to radiation of about $\lambda > 360$ nm.

11. A photocurable composition comprising at least a photopolymerizable ethylenically unsaturated monomer having at least one terminal ethylenic group and capable of forming a polymer upon exposure to actinic radiation; and 2-[p(alkylaminocarbonyl)phenyl-4,6 -bis(halomethyl)-1,3,5-triazine.

12. A photocurable composition comprising at least a photopolymerizable ethylenically unsaturated monomer having at least one terminal ethylenic group and capable of forming a polymer upon exposure to actinic radiation; and 2-[p-(n-heptylaminocarbonyl)phenyl-4,6 -bis(trichloromethyl)-1,3,5-triazine.

* * * * *